United States Patent
Tarabbia et al.

(10) Patent No.: US 12,482,668 B2
(45) Date of Patent: Nov. 25, 2025

(54) INTEGRATED CIRCUIT WITH GETTER LAYER FOR HYDROGEN ENTRAPMENT

(71) Applicant: CIRRUS LOGIC INTERNATIONAL SEMICONDUCTOR LTD., Edinburgh (GB)

(72) Inventors: Marc L. Tarabbia, Austin, TX (US); Scott P. Warrick, Austin, TX (US); Winston S. Blackley, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 426 days.

(21) Appl. No.: 18/150,398

(22) Filed: Jan. 5, 2023

(65) Prior Publication Data
US 2023/0223274 A1     Jul. 13, 2023

Related U.S. Application Data

(60) Provisional application No. 63/297,969, filed on Jan. 10, 2022.

(51) Int. Cl.
*H01L 21/322*     (2006.01)
*H01L 21/02*     (2006.01)
(Continued)

(52) U.S. Cl.
CPC .... *H01L 21/3221* (2013.01); *H01L 21/02172* (2013.01); *H01L 21/02337* (2013.01);
(Continued)

(58) Field of Classification Search
CPC ......... H01L 21/02172; H01L 21/02337; H01L 21/31144; H01L 21/3221; H01L 21/56;
(Continued)

(56) References Cited

U.S. PATENT DOCUMENTS

| | | | |
|---|---|---|---|
| 6,083,324 | A | 7/2000 | Henley et al. |
| 6,114,943 | A | 9/2000 | Lauf |

(Continued)

FOREIGN PATENT DOCUMENTS

| | | | |
|---|---|---|---|
| JP | 63046736 A | * | 2/1988 |
| JP | 2003510839 | | 3/2003 |
| TW | 401622 B | | 8/2000 |

OTHER PUBLICATIONS

WO2012/122619A1 with English Translation (Year: 2012).*
(Continued)

*Primary Examiner* — Shaun M Campbell
(74) *Attorney, Agent, or Firm* — Mitch Harris, Atty at Law, LLC; Andrew M. Harris

(57) ABSTRACT

An integrated circuit (IC) substrate manufacturing process provides time-dependent device characteristic variation due to hydrogen absorption by including one or more gettering layers near the devices that would otherwise absorb hydrogen and exhibit the variation as the hydrogen migrates in the devices. The method includes forming or mounting the devices on a top surface of the semiconductor wafer in die areas of the substrate, forming semiconductor structures in the semiconductor die areas, forming a getter layer above or adjacent to the devices in the die areas, and processing the wafer with one or more processes exposing the wafer to vapor having a hydrogen content, whereby an amount of hydrogen absorbed by the devices is reduced by presence of the getter layer. The method produces wafers including semiconductor dies with reduced hydrogen absorption by the devices and packaged ICs including the dies.

15 Claims, 10 Drawing Sheets

(51) Int. Cl.
  *H01L 21/311* (2006.01)
  *H01L 21/56* (2006.01)
  *H01L 21/70* (2006.01)
  *H01L 23/31* (2006.01)
  *H01L 23/522* (2006.01)
  *H10D 1/47* (2025.01)
  *H10D 86/85* (2025.01)

(52) U.S. Cl.
  CPC ........ *H01L 21/31144* (2013.01); *H01L 21/56* (2013.01); *H01L 21/707* (2013.01); *H01L 23/3107* (2013.01); *H01L 23/5226* (2013.01); *H10D 1/474* (2025.01); *H10D 86/85* (2025.01)

(58) Field of Classification Search
  CPC ... H01L 21/707; H01L 23/26; H01L 23/3107; H01L 23/5226; H01L 23/5228; H01L 23/53295; H01L 23/564
  See application file for complete search history.

(56) References Cited

U.S. PATENT DOCUMENTS

| | | | |
|---|---|---|---|
| 6,400,252 | B1 | 6/2002 | Smith et al. |
| 6,958,846 | B2 | 10/2005 | Huibers et al. |
| 7,202,549 | B2* | 4/2007 | Hashimoto .......... H10D 84/209 |
| | | | 257/E27.047 |
| 7,462,931 | B2 | 12/2008 | Summers |
| 7,777,318 | B2 | 8/2010 | Tornquist Hennig et al. |
| 9,035,395 | B2 | 5/2015 | Matocha et al. |
| 9,935,235 | B2* | 4/2018 | Yamaguchi .......... H10F 30/221 |
| 10,833,243 | B1 | 11/2020 | Tolpgyo et al. |
| 11,289,330 | B2 | 3/2022 | Wu et al. |
| 2004/0238920 | A1* | 12/2004 | Hashimoto .......... H10D 84/209 |
| | | | 257/E27.047 |
| 2021/0118847 | A1* | 4/2021 | Chuang .................. H01L 24/24 |
| 2022/0271167 | A1 | 8/2022 | Yamazaki et al. |
| 2023/0290973 | A1* | 9/2023 | Kitchaev .................. C25B 1/02 |
| 2024/0174515 | A1* | 5/2024 | Rebergen ............ B81C 1/00285 |

OTHER PUBLICATIONS

JP6346736 translation (Year: 1988).*
International Search Report and Written Opinion in PCT/US2023/069197 mailed on Jul. 5, 2023 (pp. 1-12 in pdf).
Office Action in Taiwan Patent Application 112101028 mailed on Nov. 9, 2023 (pp. 1-10 in pdf).
Rosan, et al., "Nitrogen Traps for Hydrogen in Tantalum", phys. stat. sol. (a) vol. 38, pp. 611-620, Dec. 1976, Weinheim, Germany. (pp. 1-10 in pdf).
Chaudron, et al., "Experimental evaluation of hydrogen getters as mitigation technique in a fusion reactor", *17th IEEE/NPSS Symposium Fusion Engineering* (Cat. No.97CH36131), Oct. 1997, pp. 208-211 vol. 1, San Diego, CA. (pp. 1-4 in pdf).
Nigray, "An Issue Paper on the Use of Hydrogen Getters in Transportation Packaging", Feb. 2000, Sandia Report SAND2000-0483, Sandia National Laboratories, Albuquerque, NM. (pp. 1-44 in pdf).
VacAero, "Getter Materials", downloaded from https://vacaero.com/information-resources/vac-aero-training/1166-getter-materials.html on Feb. 21, 2023, 3 pages (pp. 1-3 in pdf).
Office Action in Taiwan Patent Application 112101028 mailed on Apr. 10, 2024(pp. 1-9 in pdf).
Office Action in JP Application 2024-541180 dated May 2, 2025 with English translation (pp. 1-11 in pdf).

* cited by examiner

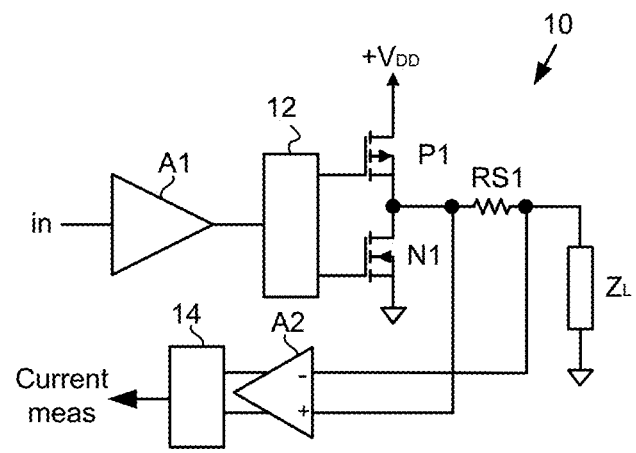
Fig. 1A
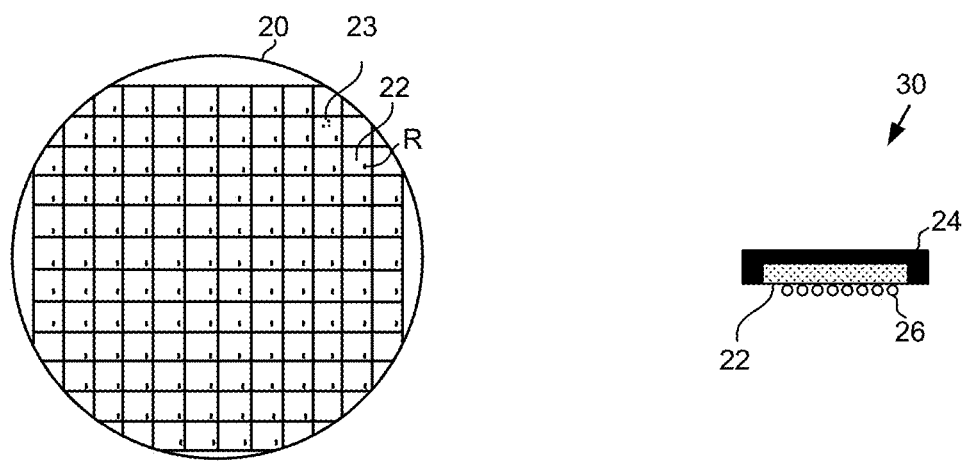
Fig. 1B
Fig. 1C

INTEGRATED CIRCUIT WITH GETTER LAYER FOR HYDROGEN ENTRAPMENT

The present application Claims priority under 35 U.S.C. § 119(e) to U.S. Provisional Patent Application Ser. No. 63/297,969 filed on Jan. 10, 2022, the disclosure of which is incorporated herein by reference.

BACKGROUND

1. Field of Disclosure

The field of representative embodiments of this disclosure relates to integrated circuits (IC), and more particularly to an IC having getter layer integrated on the substrate for extracting hydrogen that may otherwise be absorbed by a device affected by hydrogen absorption.

2. Background

Resistors having stable thermal characteristics are typically needed in current-sensing applications, such as power audio output stages, battery monitors, and motor controllers. Such low Temperature-Coefficient-of-Resistance (TCR) resistors are typically used to generate a sense voltage that is proportion to the current through the devices. Common materials for implementing such resistors on semiconductor dies are tantalum nitride (TaNx) and various silicon-chromium and silicon/chromium/nickel/titanium combinations.

Processes applied to the manufacture of silicon wafers used to produce semiconductor dies include exposure to and pass-through of vapors containing free hydrogen, including silane ($SiH_4$) gas, pure hydrogen ($H_2$), and hydrogen-nitrogen ($H_xN_y$) mixtures, from which hydrogen may be absorbed by the resistive materials used to produce thin-film resistors on the dies, in both deposition and during annealing processes. Once captured by the bodies of the thin-film resistors, the absorbed hydrogen atoms act in a manner similar to depletion carriers in a semiconductor. When a voltage is applied to the resistor, the resulting electric field alters the resistance of the resistor when the resulting current causes the hydrogen to drift within the body of the resistor in the direction of the resulting current, and recovers only when current is removed, or the current changes direction. The result is a time-dependent, signal dependent, and non-linear modulation of the resistance of the resistor, which is also dependent on temperature and the physical geometry of the resistor. The variation of the resistance results in an inaccuracy of the linearity of any current measurement made using the resistor that is dependent on the recent history of the current through the resistor, and also depends on the temperature of the resistor.

Therefore, it would be advantageous to provide an IC and an IC substrate/wafer in which time variation of characteristics caused by hydrogen absorption is prevented or reduced.

SUMMARY

Time-dependent device characteristic variation due to hydrogen introduction into devices is prevented or reversed in an integrated circuit (IC) substrate and a method of manufacture of the IC substrate.

The method reduces time-dependent variation of characteristics of devices mounted or formed on a semiconductor wafer by preventing hydrogen absorption of the devices during fabrication. The method includes forming or mounting the devices on a top surface of the semiconductor wafer in die areas of the substrate, in which the devices are of a material that absorbs hydrogen and exhibits an electrical characteristic change dependent on an amount of absorbed hydrogen. The method also includes forming semiconductor structures in the semiconductor die areas, forming a getter layer above or adjacent to the devices in the die areas, and processing the wafer with one or more processes exposing the wafer to vapor having a hydrogen content, whereby an amount of hydrogen absorbed by the devices is reduced by presence of the getter layer.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

BRIEF DESCRIPTION OF THE DRAWINGS

FIG. 1A is a simplified schematic diagram showing an example power output stage that may be implemented with one or more sense resistors RS1 fabricated by a process in accordance with an embodiment of the disclosure.

FIG. 1B is a pictorial diagram depicting an example wafer 20, in accordance with an embodiment of the disclosure.

FIG. 1C is a pictorial diagram depicting an example integrated circuit 30 in accordance with an embodiment of the disclosure.

DETAILED DESCRIPTION OF ILLUSTRATIVE EMBODIMENT

Figure 2A:
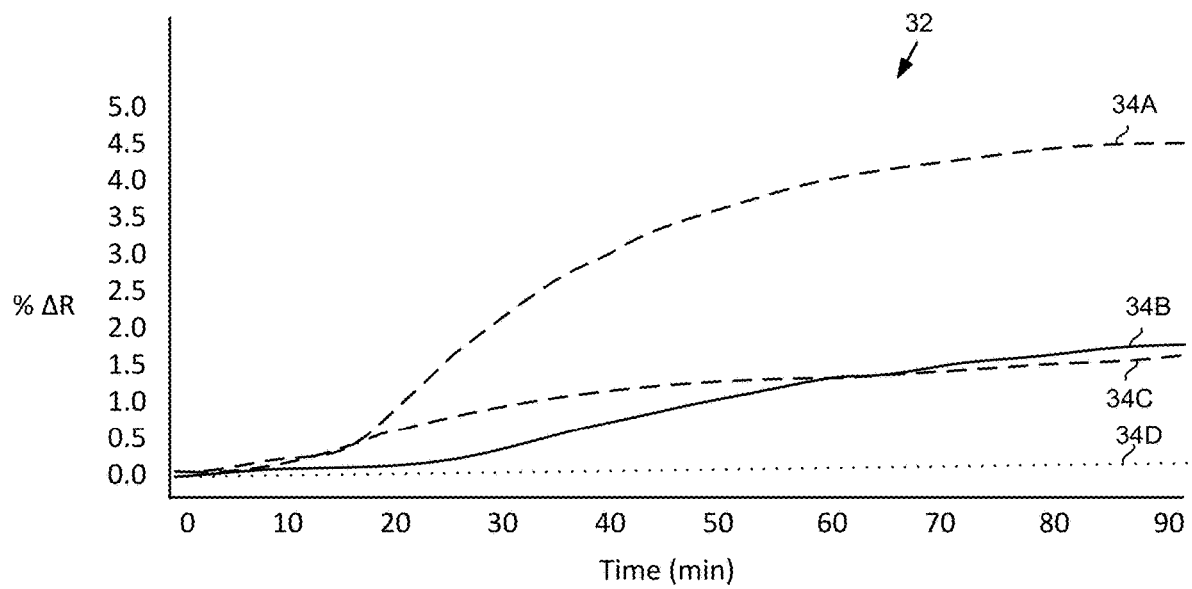
FIG. 2A is a graph 32 and FIG. 2B is a graph 36 depicting electrical effects of hydrogen absorption on a thin-film resistor.

The present disclosure encompasses integrated circuits (ICs), wafers containing dies of the ICs and methods for manufacturing the wafers/dies that reduce or eliminate hydrogen absorption by devices on the wafers that exhibit time-dependent electrical characteristics due to absorbed hydrogen. A gettering layer is provided near the devices to attract hydrogen away from the devices and entrap the hydrogen, rather than the hydrogen being absorbed by the devices. The methods also include forming other semiconductor structures on the dies and processing the wafer with one or more processes exposing the wafer to vapor having a hydrogen content, whereby an amount of hydrogen absorbed by the devices is reduced by presence of the getter layer.

Referring now to FIG. 1A, a simplified schematic diagram is shown of an example power output stage 10 that may be implemented with one or more sense resistors RS1 fabricated by a process in accordance with an embodiment of the disclosure. An input signal in is received by an amplifier A1, which provides an output to a bias circuit 12 that, in turn, operates transistors P1 and N1 to generate a power output signal provided to a load impedance $Z_L$. A current level provided to load impedance $Z_L$ through either of transistor N1 and transistor P1 is sensed by sense resistor RS1 which generates a voltage drop sensed by an amplifier A2, which provides an output to a current measurement block 14 that generates an indication of the measured current Current meas. While current sensing in the depicted example power output stage 10 is from the output of example power output stage 10, a pair of sense resistors may be used to measure the current through transistor P1 and transistor N1. Since the current through sense resistor RS1 is generally a high current level, and power supply voltage $+V_{DD}$ may also be of a higher voltage than tolerated by poly resistors in an IC in which example power output stage 10 is integrated, a thin-film resistor is used to implement sense resistor RS1 for handling the higher current/voltage levels, and to provide a low TCR resistor having a stable resistance across the thermal variation that may occur in sense resistor RS1 due to the relatively high current levels. Thin-film resistors may also be required due to the level of resistance of sense resistor RS1 needed to produce a readily measurable sense voltage. The material used to fabricate sense resistor RS1 is generally tantalum nitride (TaN), chromium-silicon, silicon/chromium/nickel combinations, or other suitable low-TCR material.

Referring now to FIG. 1B, a pictorial diagram of an example wafer 20, is shown in accordance with an embodiment of the disclosure. Wafer 20 is the result of processes described below in further detail, and incorporates one or more thin-film resistors R and other semiconductor structures 23, e.g., electronic circuits including example power output stage 10 of FIG. 1, on each of a number of dies 22. In subsequent processing, wafer 20 is singulated to obtain individual dies 22 for assembly into a packaged IC. Referring additionally to FIG. 1C, a pictorial diagram depicting an example IC 30, is shown in accordance with an embodiment of the disclosure. Example IC includes one of dies 22, an encapsulation 24 that covers die 22 and a plurality of terminals 26 for making electrical connection to circuits integrated on die 22.

Figure 2B:
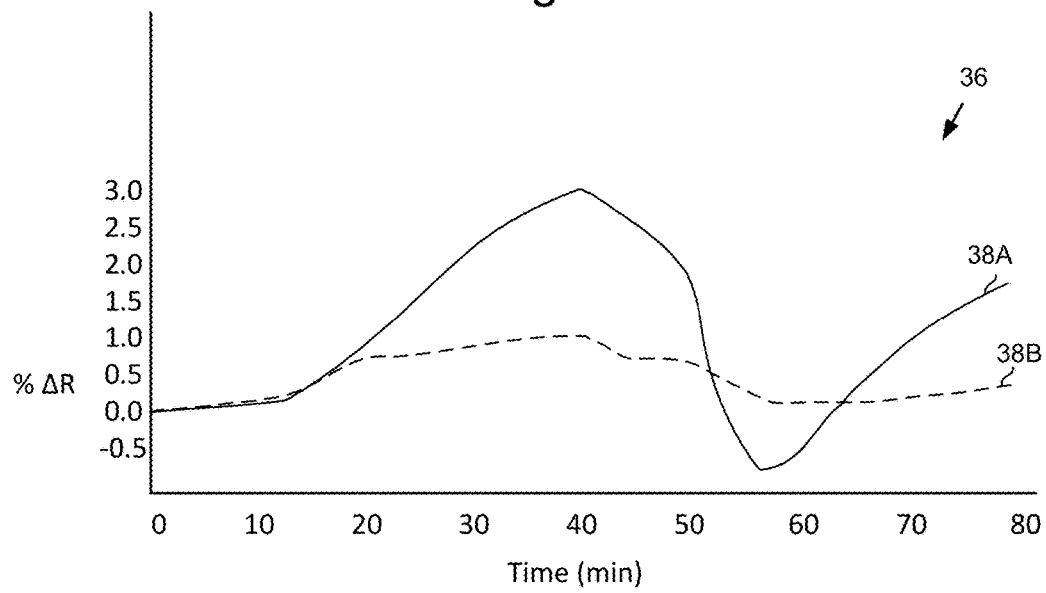

Referring now to FIG. 2A, a graph 32 depicting electrical effects of hydrogen absorption on a thin-film resistor is shown. Graph 32 illustrates a percentage change in the resistance of thin-film resistors RP over time for two different fabrication facilities (fabs) at different levels of processing. Curve 34A shows the change in resistance after alloy annealing, while curve 34B shows the pre-anneal change in resistance over time, for a first fab, fab1. Curve 34C shows the change in resistance after alloy annealing, while curve 34D shows the pre-anneal change in resistance over time, for a second fab, fab2. Since the alloy anneal process involves introduction of hydrogen via $H_2$ or $H_xN_x$ atmosphere in the furnace, an observation that an amount of hydrogen introduced into the body of resistors RP is the cause of the time-dependent change in resistance. Referring now to FIG. 2B another graph 36 depicting electrical effects of hydrogen absorption on a thin-film resistor is shown. Graph 32 illustrates a percentage change in the resistance of thin-film resistors RP over time for an applied current. Curve 38A shows the change in resistance of thin-film resistors RP in a wafer from fab1 and curve 38B shows the change in resistance of thin-film resistors RP in a wafer from fab1, with the same current level applied to thin-film resistors RP. At 40 minutes, the direction of the applied current was reversed, displaying a reversal of the effect causing increased resistance. At 55 minutes, the resistance has decreased to the point where the resistance is less than the initial resistance before any current was applied, and subsequently, the resistance increases again.

Figure 3A:
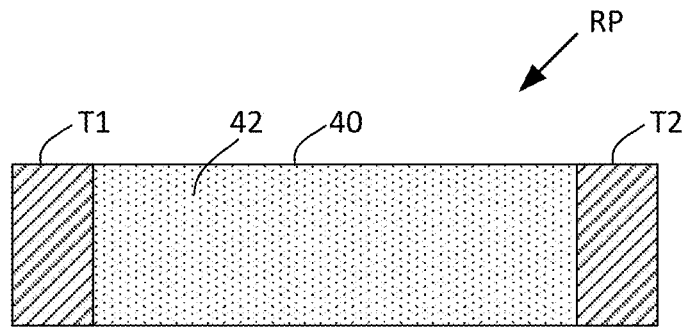
FIGS. 3A-3C are pictorial diagrams depicting behavior of absorbed hydrogen within a resistor RP.
Figure 3B:
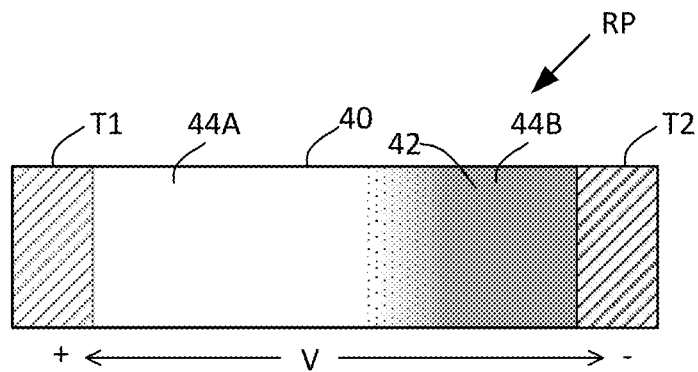
Figure 3C:
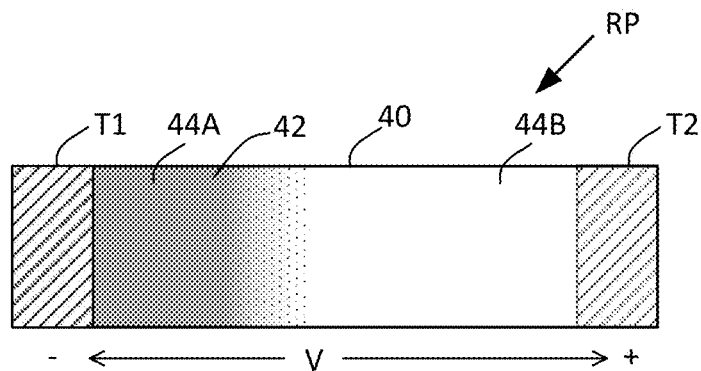

Referring now to FIGS. 3A-3C, pictorial diagrams showing the behavior of absorbed hydrogen atoms 42 within a thin-film resistor RP is shown. FIG. 3A illustrates an initial disposition of absorbed hydrogen atoms 42 within a body 40 of resistor RP, which is presumably uniform. FIG. 3B illustrates the distribution of absorbed hydrogen atoms 42 in body 40 after a voltage has been applied for a time interval between terminals T1 and T2 of resistor RP. The absorbed hydrogen atoms, which, as mentioned above, operate as depletion carriers, and migrate to the right-hand zone 44B of body 40, leaving a left-hand zone 44A of body 40 free of absorbed hydrogen atoms. FIG. 3C illustrates the distribution of absorbed hydrogen atoms 42 in body 40 after a reversed voltage has been applied between terminals T1 and T2 of resistor RP. Absorbed hydrogen atoms 42, which, as mentioned above, operate as depletion carriers, and migrate to left-hand zone 44A of body 40, leaving a right-hand zone 44B of body 40 free of absorbed hydrogen atoms. In both cases of applied voltage shown in FIG. 3B and FIG. 3C, the resistance of resistor R will be increased over that illustrated in FIG. 3A, until the applied voltage is removed and sufficient recovery time has elapsed, which is on the order of tens of minutes.

Figure 4A:
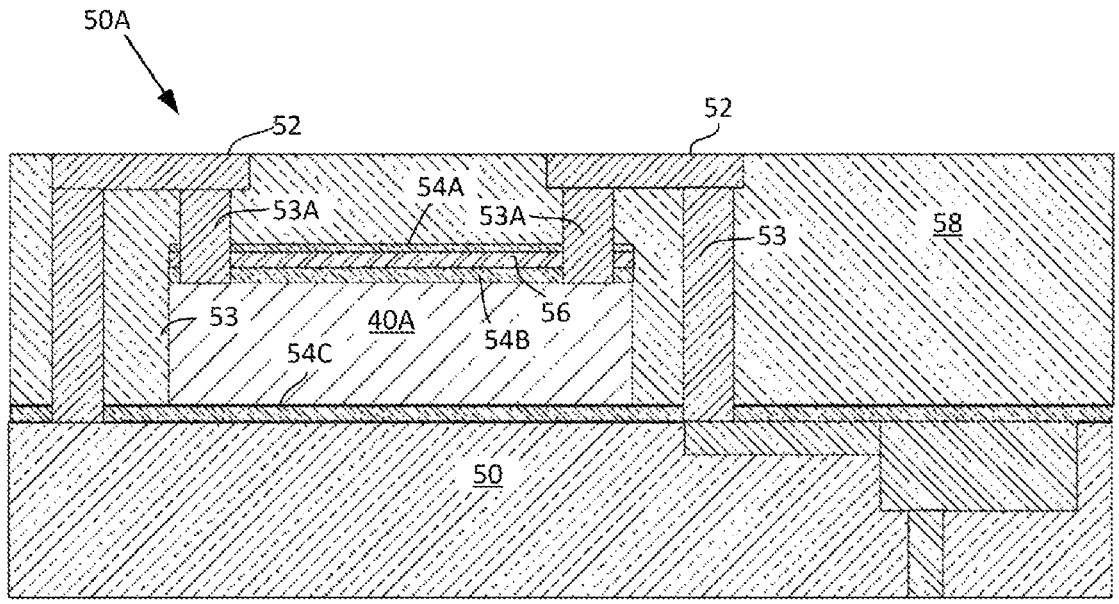
FIG. 4A is a cross-section view of an example substrate stack 50A that may be used to implement dies 22 of example wafer 20 integrated circuit assembly 30, in accordance with an embodiment of the disclosure.

Referring now to FIG. 4A, a cross-section view of an example substrate stack 50A that may be used to implement dies 22 of example wafer 20 and integrated circuit assembly 30, is shown, in accordance with an embodiment of the disclosure. A body 40A of thin-film resistor R is formed or mounted on an insulating layer 54C that is deposited on a base substrate 50. As mentioned above, body 40A may be tantalum nitride (TaN), chromium-silicon, silicon/chromium/nickel combinations, or other suitable low-TCR resistive material. Insulating layer 54C, which, for example, may be silicon nitride (SiN), N-block, silicon carbide, or the like, is provided as both an etch stop layer and as a copper diffusion barrier. Atop body 40A, an insulating material layer 54B is deposited, which may be a same material as insulating layer 54C. Atop insulating layer 54B, a gettering material layer 56 is deposited, which will trap free hydrogen in the vicinity of body 40A to prevent body 40A from absorbing hydrogen. The gettering material forming gettering material layer 56 may be an insulator, such as a metal oxide that getters hydrogen, or a metal layer, although preferably metal getter layers are implemented via another process and in another location, as described in further detail with reference to FIG. 5 below, in order to insulate the conductive material from other layers. For example, the gettering material may be lanthanum oxide, manganese oxide, or the like. Metal gettering layers may be barium or another hydrogen gettering metal, such as zirconium or niobium. Another insulating layer 54A is optionally deposited atop gettering material layer 56, which may be a same material as insulating layer 54C. A dielectric layer 58 is deposited to cover body 40A and other structures on base substrate 50, and then vias 53 and metal interconnects 52 are formed in dielectric layer 58, including vias 53A that provide the terminals of thin-film resistor R. Dielectric layer may be any suitable dielectric material having a low dielectric constant, such as silicon dioxide ($SiO_2$) or fluorinated tetraethyl orthosilicate (FTEOS).

Figure 6A:
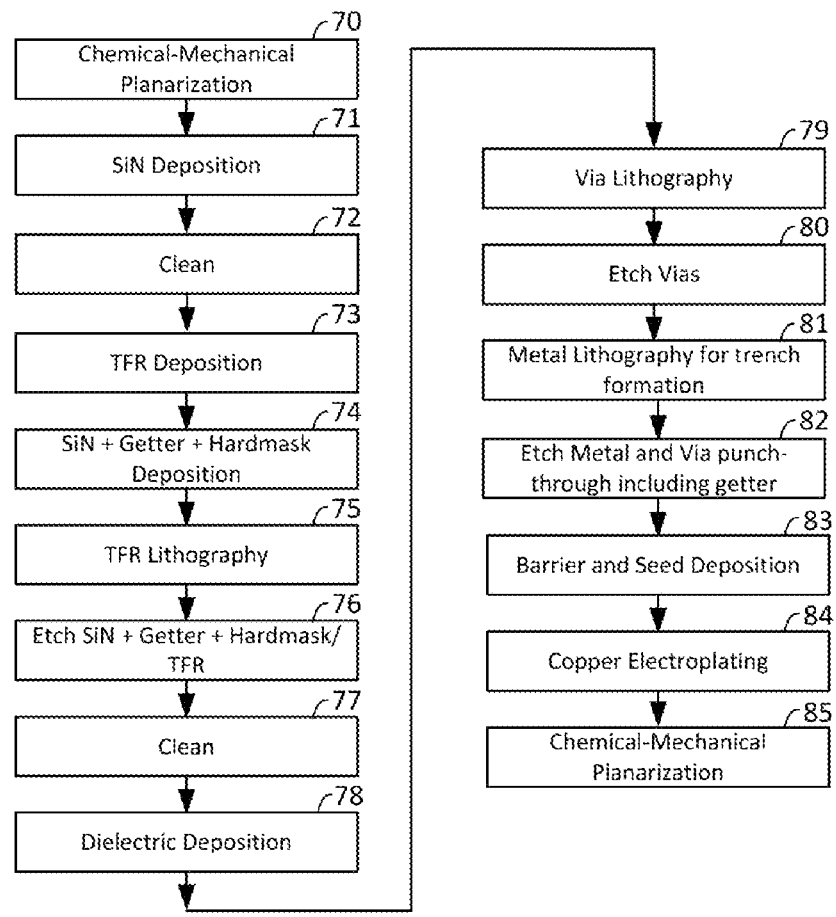
FIG. 6A is a process flow diagram depicting an example process that may be used to implement substrate stack 50A of FIG. 4A, in accordance with an embodiment of the disclosure.

Referring additionally to FIG. 6A, a process flow diagram depicting an example process that may be used to implement substrate stack 50A of FIG. 4A is shown, in accordance with an embodiment of the disclosure. First the wafer is mechanically and chemically planarized (step 70) and a layer of SiN is deposited (step 71). The wafer is cleaned (step 72) and thin film resistor (TFR) body 40A is deposited (step 73). Next layers of SiN, getter material and a hard mask are deposited (step 74) and a lithographic pattern for etching the TFR area is imposed and developed (step 75). The SiN layer, getter material, and the hardmask/TFR are etched (step 76), the wafer is then cleaned (step 77), and dielectric is deposited (step 78). Via lithography is performed (step 79), and the via locations are etched (step 80). Metal lithography to form trenches is performed (step 81), and the metal is etched and via punch-through is performed, including through the getter layer and any insulation layers that overlap the via locations (step 82). Barrier/seed material is deposited (step 83), and copper is electroplated to the seeded areas (step 84). Finally, another mechanical and chemical planarization is performed (step 85) to finish the wafer.

Figure 4B:
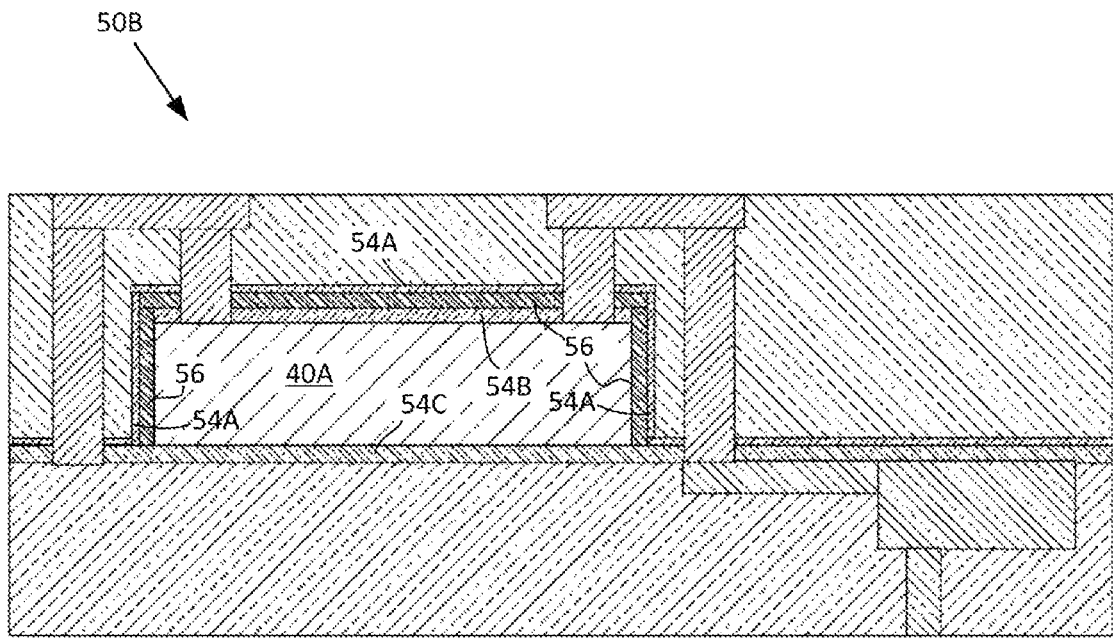
FIG. 4B is a cross-section view of an example substrate stack 50B that may be used to implement dies 22 of example wafer 20 integrated circuit assembly 30, in accordance with another embodiment of the disclosure.
Figure 6B:
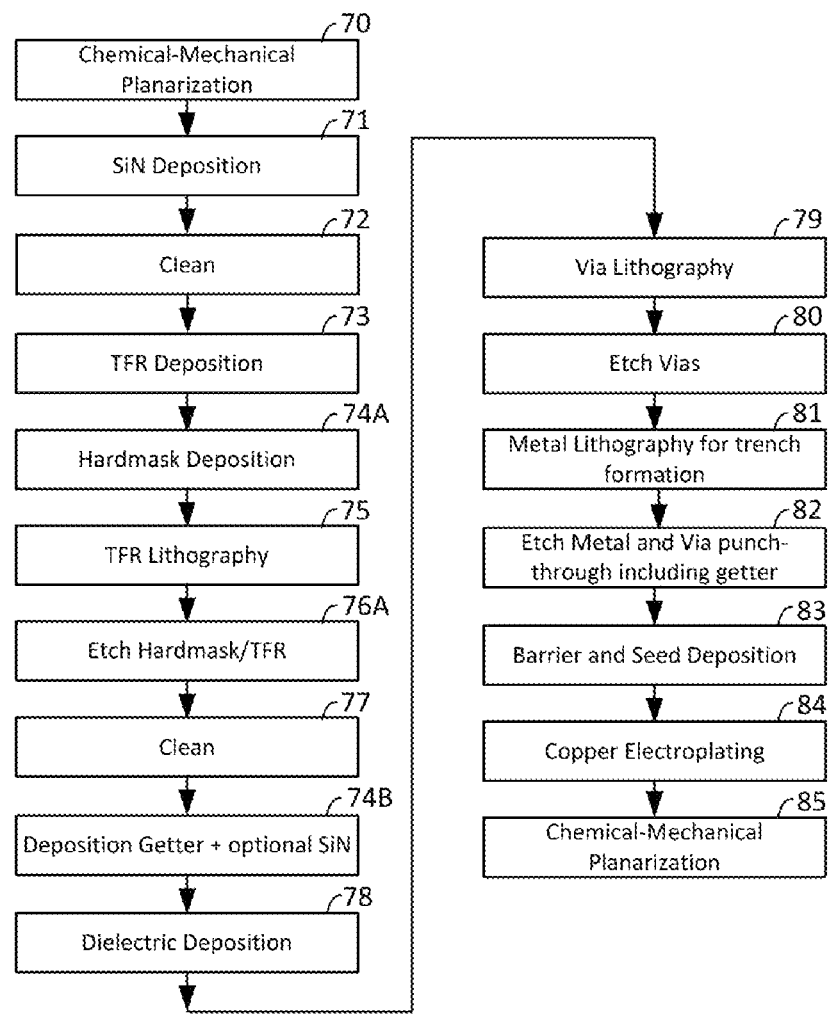
FIG. 6B is a process flow diagram depicting an example process that may be used to implement substrate stack 50B of FIG. 4B, in accordance with an embodiment of the disclosure.

Referring now to FIG. 4B, a cross-section view of an example substrate stack 50B that may be used to implement dies 22 of example wafer 20 and integrated circuit assembly 30 is shown, in accordance with another embodiment of the disclosure. Substrate stack 50B is similar to substrate stack 50A of FIG. 4A, so only differences between them will be described below. In substrate stack 50B, gettering material layer 56 is deposited on both the top and four sides of TFR body 40A, with insulating layer 54B still deposited first atop TFR body 42A. Gettering material layer 56 directly contacts TFR body 40A, but only at ends/sides of TFR body 40A, so effects of the gettering material layer 56 on resistor R are reduced. Insulating layer 54B is present, and insulating layer 54A encloses gettering material layer 56 at the sides of TFR body 40A. Insulating layer 54C extends across the substrate, as in substrate stack 50A of FIG. 4A, but gettering material layer 56 is masked and removed, so that gettering material layer 56 does not block passage of hydrogen through to base substrate 50, which is needed for passivation of gate terminals of devices located beneath or at a lower level in base substrate 50. Referring additionally to FIG. 6B, a process flow diagram depicting an example process that may be used to implement substrate stack 50B of FIG. 4B is shown, in accordance with an embodiment of the disclosure. The process flow of FIG. 6B is similar to the process flow depicted in FIG. 6A, so only differences between them will be described below. Rather than depositing the SiN, getter material and hard mask in step 74 of FIG. 6A, only the hard mask deposition is performed at that stage (step 74A of FIG. 6B) and the getter and SiN layers are not etched in step 76A of FIG. 6B. Gettering material layer 56, and optionally another SiN insulating layer (insulating layer 54A) are deposited in a new step 74B of FIG. 6B inserted after the wafer clean in step 77.

Figure 4C:
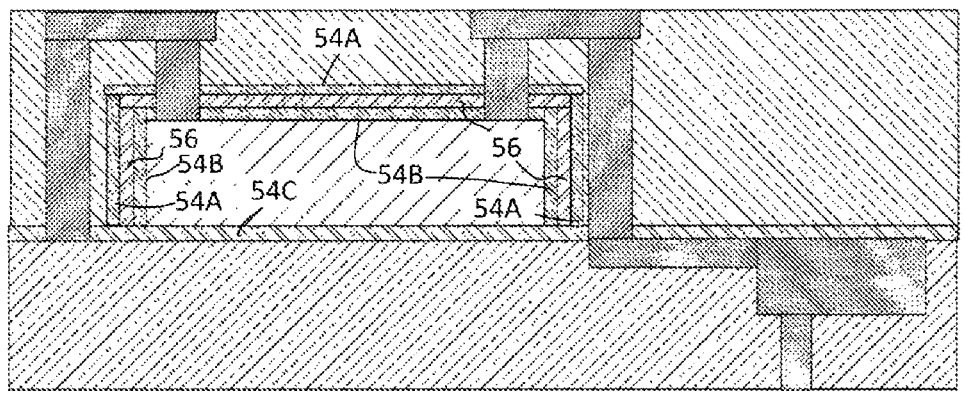
FIG. 4C is a cross-section view of an example substrate stack 50C that may be used to implement dies 22 of example wafer 20 integrated circuit assembly 30, in accordance with another embodiment of the disclosure.
Figure 6C:
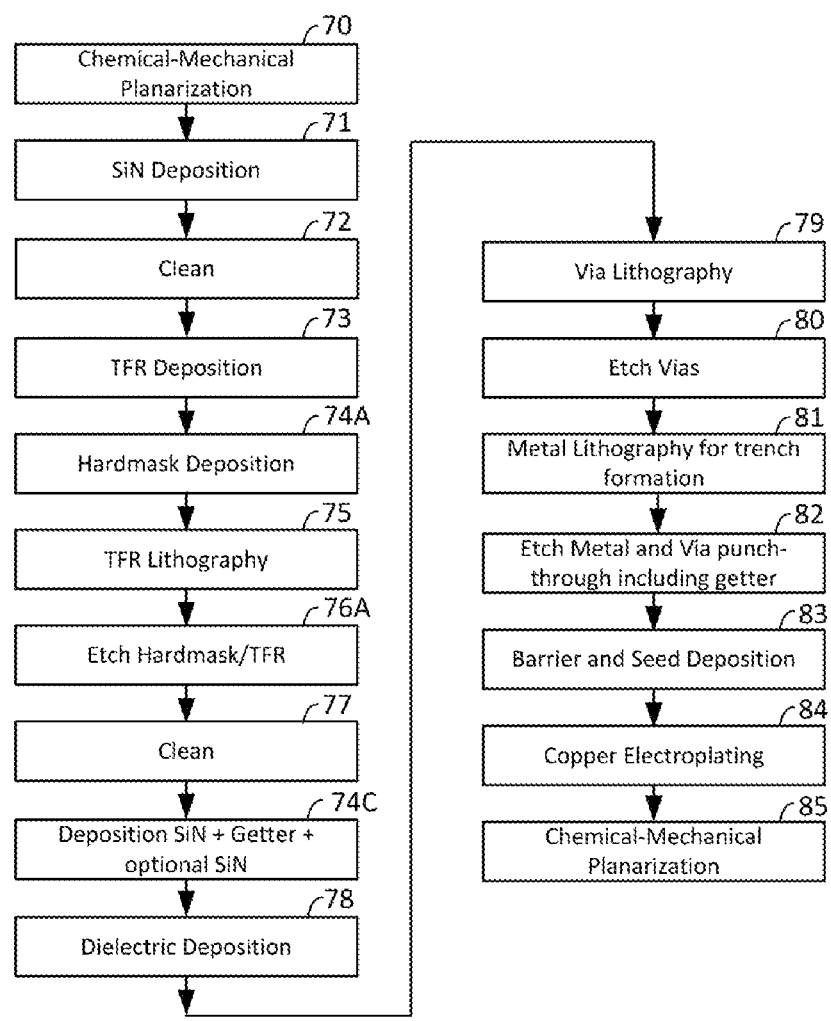
FIG. 6C is a process flow diagram depicting an example process that may be used to implement substrate stack 50C of FIG. 4C, in accordance with an embodiment of the disclosure.

Referring now to FIG. 4C, a cross-section view of an example substrate stack 50C that may be used to implement dies 22 of example wafer 20 and integrated circuit assembly 30 is shown, in accordance with another embodiment of the disclosure. Substrate stack 50C is similar to substrate stack 50B of FIG. 4B, so only differences between them will be described below. In substrate stack 50C, insulating layer 54B is deposited on both the sides and top of TFR body 40A, isolating TFR body 40A from any contact with gettering material layer 56. Referring additionally to FIG. 6C, a process flow diagram depicting an example process that may be used to implement substrate stack 50C of FIG. 4C is shown, in accordance with an embodiment of the disclosure. The process flow of FIG. 6C is similar to the process flow depicted in FIG. 6B, so only differences between them will be described below. After the wafer clean in step 77, in the process of FIG. 6C, step 74C of FIG. 6C deposits SIN insulating layer 54B, then getter material layer 56 and optionally insulating layer 54A.

Figure 4D:
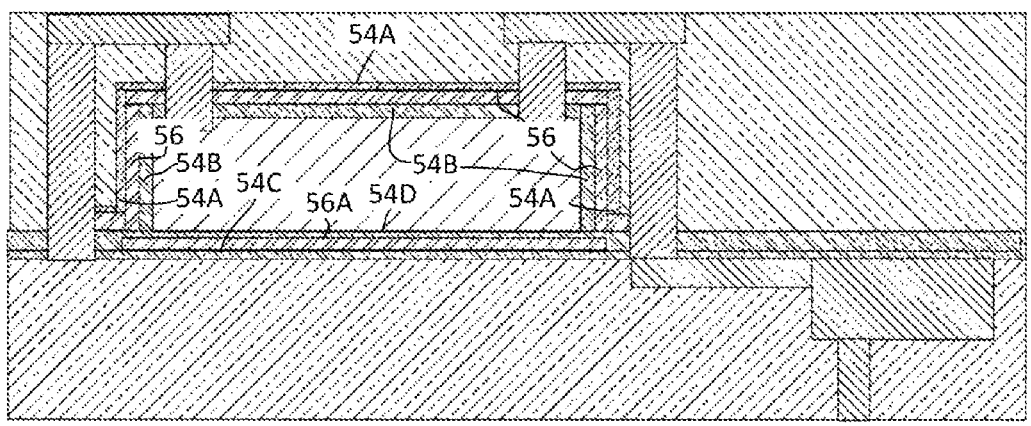
FIG. 4D is a cross-section view of an example substrate stack 50D that may be used to implement dies 22 of example wafer 20 integrated circuit assembly 30, in accordance with another embodiment of the disclosure.
Figure 6D:
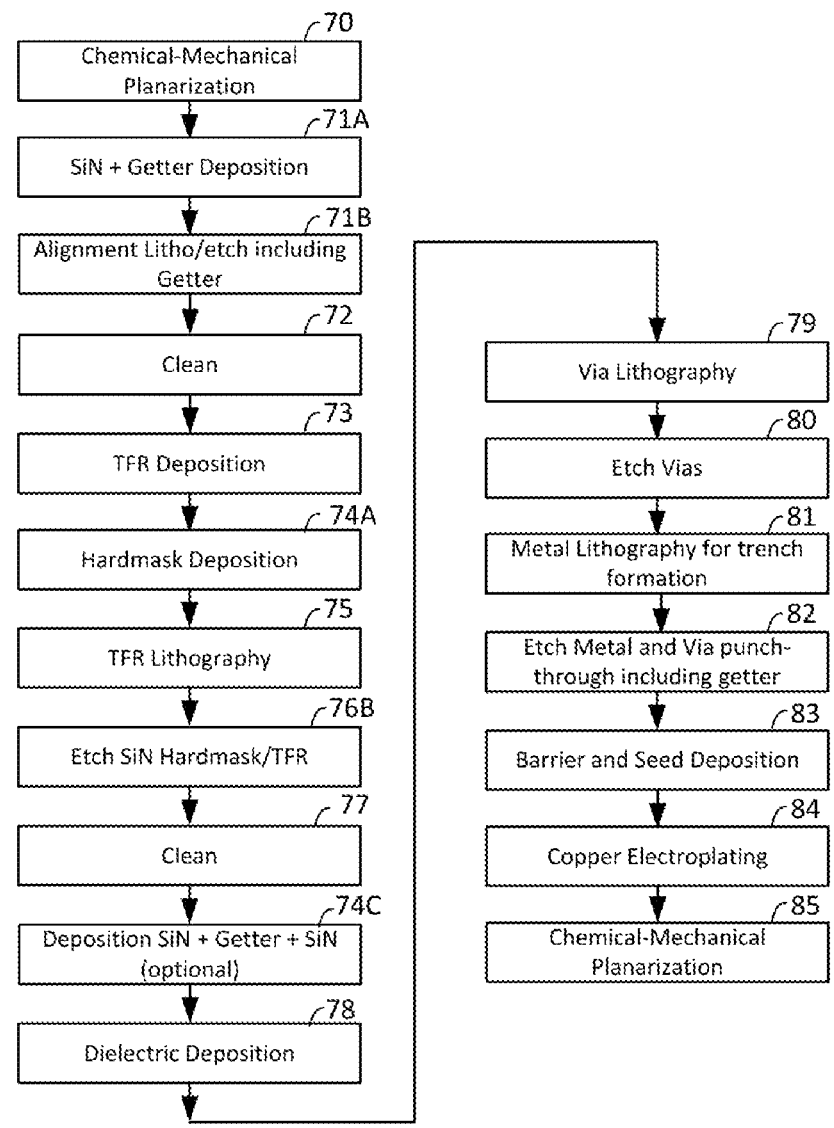
FIG. 6D is a process flow diagram depicting an example process that may be used to implement substrate stack 50D of FIG. 4D, in accordance with an embodiment of the disclosure.

Referring now to FIG. 4D, a cross-section view of an example substrate stack 50D that may be used to implement dies 22 of example wafer 20 and integrated circuit assembly 30 is shown, in accordance with another embodiment of the disclosure. Substrate stack 50D is similar to substrate stack 50C of FIG. 4C, so only differences between them will be described below. In substrate stack 50D, before TRF body 40A is formed or mounted on base substrate 50, insulating layer 54C is deposited, a second getter material layer 56A and another insulating layer 54D are formed on base substrate 50 in an area of TRF body 40A, so that TRF body 40A is effectively surrounded by gettering material. Referring additionally to FIG. 6D, a process flow diagram depicting an example process that may be used to implement substrate stack 50D of FIG. 4D is shown, in accordance with an embodiment of the disclosure. The process flow of FIG. 6D is similar to the process flow depicted in FIG. 6C, so only differences between them will be described below. After planarization in step 70, insulating layer 54C and second getter material layer 56A are deposited in step 71A. Alignment and lithography/etching are performed on getter material layer step 71B, which may be combined with other required lithographic processes at this stage. In the etch process after the TFR lithograph in step 75, step 76B etches TRF body 42A and insulating layer 54D in step 76B. Subsequent formation of the structure above TRF body 42A proceeds as described above with reference to FIG. 6C.

Figure 5:
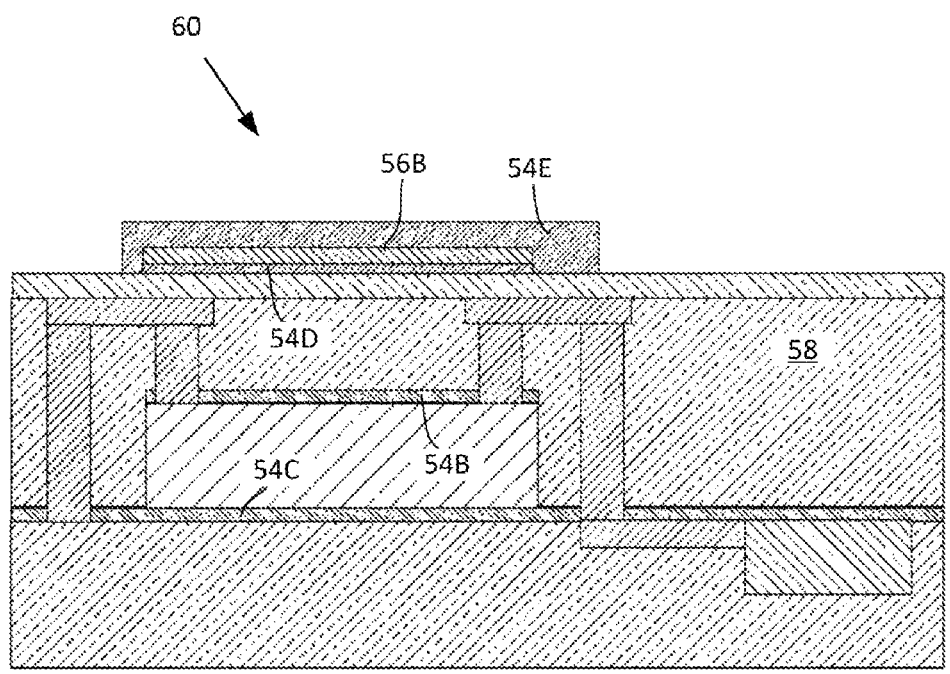
FIG. 5 is a cross-section view of an example substrate stack 60 that may be used to implement dies 22 of example wafer 20 integrated circuit assembly 30, in accordance with another embodiment of the disclosure.

Referring now to FIG. 5, a cross-section view of an example substrate stack 60 that may be used to implement dies 22 of example wafer 20 integrated circuit assembly 30 is shown, in accordance with another embodiment of the disclosure. In substrate stack 60, a getter layer 56B is deposited or attached above dielectric layer 58 and an optional insulating layer 54E may be included, if needed to isolate getter layer 56B from dielectric layer 58 or other features, such as circuit patterns. Substrate stack 60 is particularly suited to metal getter materials, as mentioned above, to provide isolation of the metal forming getter layer 56B from other circuit features.

In summary, this disclosure shows and describes methods of manufacturing integrated circuit substrates and the structure of the integrated circuit substrates. The method are methods of reducing time-dependent variation of characteristics of devices mounted or formed on a semiconductor wafer during fabrication due to hydrogen absorption. The methods may include forming or mounting the devices on a top surface of the semiconductor wafer in die areas of the substrate, in which the devices are of a material that absorbs hydrogen and exhibits an electrical characteristic change dependent on an amount of absorbed hydrogen. The methods further include forming semiconductor structures in the semiconductor die areas, forming a getter layer above or adjacent to the devices in the die areas, and processing the wafer with one or more processes exposing the wafer to vapor having a hydrogen content, so that an amount of hydrogen absorbed by the devices is reduced by presence of the getter layer. Semiconductor wafers according to embodiments of the disclosure may include a base wafer, a plurality of devices mounted or formed in die areas on a top side of the base wafer, in which the devices are of a material that absorbs hydrogen and exhibits an electrical characteristic change dependent on an amount of absorbed hydrogen, semiconductor structures formed on the top side of the base wafer in die areas of the base wafer, and a getter layer disposed above or adjacent to the individual devices. Integrated circuits according to embodiments of the disclosure may include a semiconductor die having a device mounted or formed on a substrate thereof, in which the device is of a material that absorbs hydrogen and exhibits an electrical characteristic change dependent on an amount of absorbed hydrogen. The semiconductor die may include one or more semiconductor structures formed on the top side of the substrate of the die and a getter layer disposed above or adjacent to the device. The integrated circuits may further include an encapsulation formed around the die, and a plurality of terminals provided on one or more external surfaces of the encapsulation and connected to electrical terminals of the die.

In some example embodiments, the forming or mounting the devices forms or mounts tantalum nitride thin-film or silicon chromide resistors on the wafer. In some example embodiments, the forming a getter layer is performed by depositing metal in a layer above the devices that is separated from the device by one or more insulating layers. In some example embodiments, the forming a getter layer forms the getter layer adjacent to one or more surfaces of the devices. In some example embodiments, the forming a getter layer may form the getter layer directly on the one or more surfaces of the devices. In some example embodiments, the forming a getter layer may further include depositing a device protection insulation layer on one or more surfaces of the devices, and depositing the getter layer on the device protection insulation layer. In some example embodiments, a material of the getter layer is an insulating material, which in some example embodiments may be a metal oxide. In some example embodiments, the getter layer is formed only above a top surface of the devices. In other example embodiments, the getter layer is formed above a top surface and on or adjacent to sides of the devices. In some example embodiments, the getter layer is a second getter layer, and wherein the method further includes: prior to forming or mounting the devices, forming a first getter layer on the wafer in mounting or formation areas of the devices in the die areas, and forming an insulative layer atop the first getter layer, in which the forming or mounting the devices forms or mounts the devices on the insulative layer above the first getter layer. In some example embodiments the method further includes masking the first getter layer around the devices to provide for passage of hydrogen beneath the first getter layer, and removing unmasked portions of the first getter layer.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to devices other than resistors that are affected by hydrogen absorption.

What is claimed is:

1. A method of reducing time-dependent variation of characteristics of thin-film resistors mounted or formed on a substrate of a semiconductor wafer during fabrication due to hydrogen absorption, the method comprising:
   forming a first getter layer on the semiconductor wafer in mounting or formation areas of the thin-film resistors in die areas of the substrate;
   forming a first insulating layer atop the first getter layer;
   subsequent to the forming of the first getter layer, forming or mounting the thin-film resistors on the first insulating layer above the first getter layer above a top surface of the semiconductor wafer in the die areas of the substrate, wherein the thin-film resistors are of a material that absorbs hydrogen and exhibits an electrical characteristic change dependent on an amount of absorbed hydrogen;
   forming semiconductor structures in the die areas;
   forming a second insulating layer on a top surface of the thin-film resistors in the die areas;
   forming a second getter layer on the second insulating layer from an insulating material; and
   processing the semiconductor wafer with one or more processes exposing the semiconductor wafer to vapor having a hydrogen content, whereby an amount of hydrogen absorbed by the thin-film resistors is reduced by presence of the getter layer.

2. The method of claim 1, wherein the forming or mounting the thin-film resistors forms or mounts tantalum nitride thin-film or silicon-chromium resistors on the semiconductor wafer.

3. The method of claim 1, wherein the material of the second getter layer is a metal oxide.

4. The method of claim 1, wherein the second getter layer is formed only above a top surface of the insulating layer in areas of the thin-film resistors.

5. The method of claim 1, further comprising:
   masking the first getter layer around the thin-film resistors to provide for passage of hydrogen beneath the first getter layer; and
   removing unmasked portions of the first getter layer.

6. A semiconductor wafer, comprising:
   a base wafer;
   a plurality of thin-film resistors mounted or formed in die areas on a top side of the base wafer, wherein the thin-film resistors are of a material that absorbs hydrogen and exhibits an electrical characteristic change dependent on an amount of absorbed hydrogen;

a first getter layer formed on the base wafer in mounting or formation areas of the thin-film resistors in the die areas;

first insulating layer formed on a top surface of the thin film resistors in the die areas;

semiconductor structures formed on the top side of the base wafer in die areas of the base wafer;

a second insulating layer atop the first getter layer, wherein the thin-film resistors are formed or mounted on the second insulating layer; and a second getter layer formed from an insulating material disposed above or adjacent to the first insulating layer.

7. The semiconductor wafer of claim 6, wherein the plurality of thin-film resistors are tantalum nitride or silicon chromium thin-film resistors.

8. The semiconductor wafer of claim 6, wherein the insulating material is a metal oxide.

9. The semiconductor wafer of claim 6, wherein the second getter layer is only disposed above a top surface of the first insulating layer in areas of the thin-film resistors.

10. The semiconductor wafer of claim 6, wherein the second getter layer is restricted to areas around the thin-film resistors to provide for passage of hydrogen through gaps in the first getter layer during fabrication.

11. An integrated circuit, comprising:

a semiconductor die having a thin-film resistor mounted or formed on a substrate thereof, wherein the thin-film resistor is of a material that absorbs hydrogen and exhibits an electrical characteristic change dependent on an amount of absorbed hydrogen, wherein the semiconductor die includes one or more semiconductor structures formed on the top side of the substrate of the die, a first getter layer on the die in a mounting or formation area of the thin-film resistor, a first insulating layer formed atop the first getter layer, wherein the thin-film resistor is formed or mounted on the first insulating layer, a second insulating layer formed atop the thin-film resistor, and a second getter layer formed from an insulating material disposed on the second insulating layer;

an encapsulation formed around the die; and a plurality of terminals provided on one or more external surfaces of the encapsulation and connected to electrical terminals of the die.

12. The integrated circuit of claim 11, wherein the thin-film resistor is a tantalum nitride or silicon-chromium thin-film resistor.

13. The integrated circuit of claim 11, wherein the insulating material is a metal oxide.

14. The integrated circuit of claim 11, wherein the getter layer is only disposed above the insulating layer in an area of the thin-film resistor.

15. The integrated circuit of claim 11, wherein the second getter layer is restricted to areas around the thin-film resistor to provide for passage of hydrogen during fabrication through gaps in the first getter layer during fabrication.

* * * * *